United States Patent [15] 3,655,439

Seiter [45] Apr. 11, 1972

[54] METHOD OF PRODUCING THIN LAYER COMPONENTS WITH AT LEAST ONE INSULATING INTERMEDIATE LAYER

[72] Inventor: Hartmut Seiter, Munich, Germany

[73] Assignee: Siemens Aktiengesellschaft, Berlin, Germany

[22] Filed: June 16, 1969

[21] Appl. No.: 833,341

[30] Foreign Application Priority Data

June 19, 1968 Germany ......................P 17 69 627.4

[52] U.S. Cl. ..........................117/212, 117/107.2, 148/175, 317/235 F

[51] Int. Cl. .......................................C23c 13/24, H01l 3/10

[58] Field of Search ..........................148/175; 317/235, 234; 117/106, 106 D, 212, 107.2

[56] References Cited

UNITED STATES PATENTS

| | | | |
|---|---|---|---|
| 3,518,503 | 6/1970 | Doo | 317/235 UX |
| 3,424,955 | 1/1969 | Seiter | 317/234 UX |
| 3,414,434 | 12/1968 | Manaserit | 217/25 UX |
| 3,399,072 | 8/1968 | Pulliam | 117/106 X |
| 2,972,555 | 2/1961 | Deutscher | 117/106 |

*Primary Examiner*—Ralph S. Kendall
*Assistant Examiner*—Alan Grimaldi
*Attorney*—Curt M. Avery, Arthur E. Wilfond, Herbert L. Lerner and Daniel J. Tick

[57] ABSTRACT

Described is a method of producing thin layer components, separated by at least one insulating layer and comprised of semiconductor material, particularly silicon. The method is characterized by the fact that an amorphous layer of insulated material is pyrolytically precipitated on a substrate wafer, comprised of monocrystalline semiconductor material. The amorphous layer is converted into a monocrystalline layer by using the monocrystalline substrate and the thus formed substrate, which has a homogeneous crystallographic orientation, is used to grow another epitactic semiconductor layer, preferably of silicon.

18 Claims, 6 Drawing Figures

Figure 1:
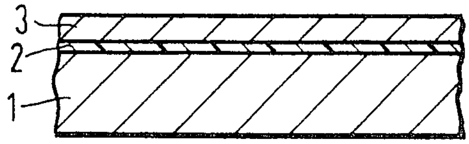

METHOD OF PRODUCING THIN LAYER COMPONENTS WITH AT LEAST ONE INSULATING INTERMEDIATE LAYER

The present invention relates to a method for producing thin layer components comprised of semiconductor material, particularly silicon, which are separated from each other by at least one insulating layer.

During the production of thin-layer semiconductor components, the problem arises to electrically insulate the components, produced in a known method in the applied epitactic layers, against their common silicon substrate.

The present invention indicates a possibility for solving this problem, which not only combines the advantage of a rational and reproducible process for producing such components with the good electrical characteristics obtained thereby, but also permits the production of component structures, which could not previously be realized by the known methods or only with difficulty.

According to my invention one pyrolytically precipitates on a substrate wafer, comprised of monocrystalline semiconductor material an amorphous layer of insulating material. This layer is converted into a monocrystalline layer by employing the monocrystalline substrate as the seed. The thus formed substrate which has uniform crystallographic orientation, is used for the growth of another epitactic semiconductor material layer, preferably comprised of silicon.

A further development of the invention provides that several layers are superimposed in the same sequence and removed again, when necessary for producing special geometrical structures, at predetermined places, possibly by using masking layers.

It is within the framework of the invention to use, as the basic substrate disc, a silicon crystal with low Miller indices, more particularly with (100)-orientation. This is particularly important, as the original substrate wafer is later used as a seed, during the recrystallization of the pyrolytically applied amorphous insulating layer, since the (100)-surface constitutes a preferred growth direction for substances which crystallize according to the spinel structure, and thus are particularly suitable. In the same manner, it is possible to use a silicon crystal with a (211)-orientation, since here the atomic roughness of the silicon is considerable, i.e., the surface effective as a seed is considerably enlarged.

To promote a uniform recrystallization, it is preferable to subject the silicon substrate, prior to the precipitation of the amorphous layer, to an etching process for the purpose of removing the "damage layer."

According to a particularly preferred embodiment of the invention, the substances are coated in the form of insulating intermediate layers, which crystallize as spinel structures, at a layer thickness within a range of 0.1 to 1 $\mu$, since spontaneous crystal seed formation can hardly be avoided, with much larger layers.

In addition to magnesium aluminum spinels of an $MgO:Al_2O_3 = 1:1$ to 1:4 combination, zinc aluminum spinels of the same composition ratio were also found to be very suitable insulating intermediary layers. Thus, the method combines the electrical advantages of silicon crystal layers on insulating monocrystals, in this instance, e.g., silicon upon a spinel, with the advantages of a silicon substrate which, compared to the other substrates is relatively inexpensive and easily workable and, furthermore, shows good crystal perfection.

It is within the framework of the present invention to effect the precipitation of the amorphous layer which forms the spinel, by pyrolysis of the appropriate organic vaporizable aluminum and magnesium or zinc compound which already contains a metal oxygen chemical bond and is present at an appropriate mixing ration. In order to improve the crystallizing ability, it is of particular advantage to also evaporate, during the precipitation of the amorphous layer, slight amounts of $TiO_2$, e.g., 0.1 percent. This is preferably effected through the addition of appropriate amounts of tetraethoxytitanium, Ti(OC2H5b04.

The aluminum containing component can be aluminum isopropylate $Al((CH_3)_2CHO)_3$ or secondary aluminum butylate $Al\,(CH_3CH_2CH\,(CH_3)O)_3$, while the magnesium containing component can be magnesium acetylacetonate $Mg(CH_3COCH = C(CH_3)O_2$ and the zinc containing component is zinc acetylacetonate $Zn(CH_3COCH = C(CH_3)O_2$.

Moreover, it was found particularly preferable to evaporate, as the initial material for the formation of the insulating layer, aluminum magnesium ethylate $Mg(Al(OC_2H_5)_4)_2$.

It is preferred to use, for the pyrolysis process of metal-organic compounds a carrier gas, such as nitrogen, argon, nitrogen hydrogen or nitrogen oxygen mixture.

In accordance with a special embodiment, the carrier gas is charged, at 100° to 300° C, with the organometallic compound and, subsequently the organometallic compound is dissociated at 500° to 600° C at the hot silicon substrate. A tubular furnace is used to this end, e.g., as a reaction chamber with two temperature regions, whereby the carrier gas first flows through the colder region, where it is charged with the specified compounds which are, subsequently, dissociated in the hot furnace region on a silicon substrate, at 500° to 600° C.

The recrystallization of the amorphous layer, that is the mixed oxide must be so effected that only the silicon surface acts as a seed, since a spontaneous seed formation on the free surface, or in the interior of the oxide layer, would lead to polycrystalline disturbances. It was, therefore, found to be particularly preferred to use a low recrystallization temperature, e.g., below 950° C, in addition to etching the substrate, for the purpose of removing the "damage layer," prior to the use of suitable crystallographic orientation of the substrate (that is the (100) or (211) surfaces). The tempering time amounts, thereby, to approximately 4 hours. If an amorphous oxide layer with an excess of aluminum oxide is specified, e.g., $MgO:Al_2O_3 = 1:2$ to 1:4 in place of the stoichiometric composition $MgO:Al_2O_3$, then the recrystallization temperature must not exceed 950° C, as otherwise a precipitation of $Al_2O_3$ can result during prolonged tempering periods. The existence range of $\alpha$-$Al_2O_3$ starts below 950° C and has the same lattice type as spinel and can, therefore, be crystallized in a single phase.

The thus formed substrate with homogeneous crystallographic orientation is then provided, according to known method steps of the semiconductor art, with epitactic growth layers, particularly of silicon, and processed into semiconductor components.

The method of the invention affords the possibility to produce thin layer semiconductor components and to build-up, if necessary, monocrystalline multi-layers, e.g., in the following sequence: silicon base crystal insulating layer, silicon epitaxy layer, insulating layer, silicon epitaxy layer, insulating layer, silicon epitaxy layer. Such layers can be defined for removal, with the aid of oxide masks, by phosphoric acids, at 300° C, with respect to a spinel layer, and with a hydrofluoric acid nitric acid mixture for a silicon layer, as the spinel is etched by phosphoric acid five to 10 times faster than, for example the $SiO_2$ layer which serves for masking, while the silicon is virtually not attacked, thereby.

In the drawing FIGS. 1 to 6 illustrate the sequential steps utilizing the present invention, to produce an insulating component on a silicon base.

FIG. 1 depicts a simple layer sequence which develops during the execution of the method of the present invention. A substrate wafer 1, comprised of a monocrystalline (100) oriented silicon crystal, which is freed from its "damage layer" by etching in a hydrofluoric nitric acid mixture and given a thickness of about 300 $\mu$ is used. A pyrolysis, for example of magnesium aluminum ethylate produces on this surface an insulating layer of 0.5 $\mu$ thick comprised, e.g., of an amorphous oxide layer 2, which is recrystallized at a temperature of 950° C into a spinel structure of the following composition: $MgO:Al_2O_3 = 1:1$, during approximately 4 hours. Then, by employing method steps which are known in the semiconductor art, an epitactic silicon layer 3 is precipitated at a layer thickness of about 2 to 10 $\mu$ upon the substrate wafer, which is now comprised of two layers 1 and 2 with homogeneous orientation. The further processing into components takes place according to known measures.

Figure 2:
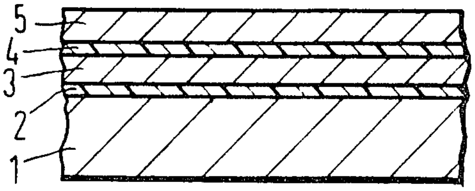

FIG. 2 illustrates a special embodiment wherein two insulating layers (2 and 4) resulted with the aid of the method of the invention by repeating the method steps. Thereby, the epitactic silicon layer, indicated as 3, serves as a seed for the amorphous insulating layer 4, precipitated thereon. The last precipitated epitactic silicon layer is indicated at 5.

FIGS. 3 to 6 show a simple embodiment example for producing insulated silicon regions by employing the selective epitaxy method, without mechanical method steps.

Figure 3:
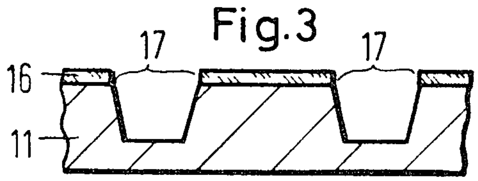
Figure 4:
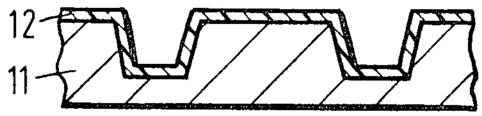
Figure 5:
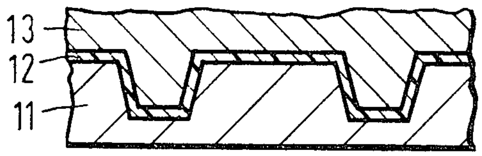
Figure 6:
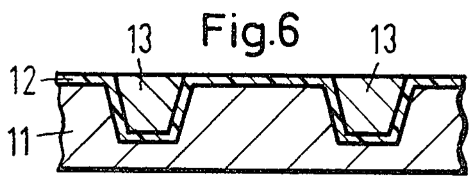

FIG. 3 illustrates how tub-shaped depressions 17 are cut, with the aid of an $SiO_2$ layer 16, into a crystal wafer 11, comprises of n-silicon. In FIG. 4, after the remainder of the $SiO_2$ layer 16 is removed over its entire area, an insulating layer 12, comprised of magnesium aluminum oxide, is produced and recrystallized. Using this device as a substrate for an epitactic growth process, a layer 13, comprised of p-doped silicon is subsequently deposited, this is seen in FIG. 5. A subsequent etching process in a mixture of nitric acid·hydrofluoric acid, produces, by means of employing the etching mask comprised of magnesium aluminum oxide, the device shown in FIG. 6, whereby the individual silicon regions of p-coated silicon 13 are electrically insulated from each other on the common base crystal 11, via the insulating layer 12.

I claim:

1. A method of producing thin layer components, separated by at least one insulating layer and comprised of semiconductor material which comprises depositing an amorphous layer of spinel, selected from magnesium aluminum and zinc aluminum spinels upon a monocrystalline silicon body, converting said amorphous layer into a monocrystalline layer by heating to recrystallize using the monocrystalline substrate as a seed crystal to provide homogeneous crystallographic orientation and subsequently depositing monocrystalline material upon the now monocrystalline spinel.

2. The method of claim 1, wherein a carrier gas is charged, at 100° to 300° C with the organometallic compound and the organometallic compound is thereafter dissociated, at 500° to 600° C at the hot silicon substrate.

3. The method of claim 1, wherein the recrystallization of the amorphous layer is effected at a temperature below 950° C, by a 4 hour tempering process.

4. The method of claim 1, wherein the substrate body and the epitactic layers are of silicon.

5. The method of claim 1, wherein several layers are superimposed in the same sequence and are locally removed with the aid of masking layers in order to produce special geometrical structures.

6. The method of claim 1, wherein the substrate has (100) orientation.

7. The method of claim 1, wherein the base substrate is a silicon crystal with (211)-orientation.

8. The method of claim 1, wherein the silicon body is etched prior to precipitating the amorphous layer.

9. The method of claim 8, wherein the substance which crystallizes according to the spinel structure is applied in a layer thickness of 0.1 to 1 $\mu$.

10. The method of claim 9, wherein a spinel of an $MgO:Al_2O_3 = 1:1$ to $1:4$ composition is produced as the insulating layer.

11. The method of claim 9, wherein a spinel of $ZnO:Al_2O_3 = 1:1$ to $1:4$ composition is produced as the insulating layer.

12. The method of claim 11, wherein 0.1 percent $TiO_2$ is evaporated during the precipitation of the amorphous layer.

13. The method of claim 12, wherein tetra ethoxytitanium $Ti(OC_2H_5b04$, is used.

14. The method of claim 12 wherein a compound selected from aluminum-isopropylate $Al((CH_3)_2CHO)_3$ and secondary aluminumbutylate $Al(CH_3CH_2CH)CH_3)O)_3$ is used as the aluminum-containing component.

15. The method of claim 12, wherein magnesium acetylacetonate is used as the magnesium-containing component.

16. The method of claim 12, wherein aluminum-magnesium-ethylate $Mg(Al(OC_2H_5)_4)_2$ is used as the material for forming the insulating layer.

17. The method of claim 10, wherein zinc acetyl acetonate $(Zn(CH_3COCH = C(CH_3)O)_2$ is used as the zinc containing component.

18. The method of producing a plurality of silicon semiconductor thin layer components where the individual semiconductor regions are separated by at least one insulating layer, crystallized according to the spinel type which comprises forming a masking layer on a semiconductor layer, producing tub-shaped depressions on the substrate wafer of monocrystalline semiconductor material by said masking layer and the photo varnish technique, removing the masking layer, precipitating an amorphous spinel insulating layer upon the substrate heated to 500° to 600° C, by pyrolysis of an organometallic compound, said spinel being selected from magnesium aluminum and zinc aluminum spinels, subsequently using the monocrystalline semiconductor substrate as a seed to convert said amorphous spinel layer into a monocrystalline spinel layer by tempering for several hours at a temperature below 950° C and epitactically precipitating another semiconductor layer upon said monocrystalline spinel insulating layer in uniform crystallographic orientation.

* * * * *